(12) United States Patent
Fowler

(10) Patent No.: US 9,426,390 B2
(45) Date of Patent: Aug. 23, 2016

(54) CMOS IMAGING ARRAY WITH IMPROVED NOISE CHARACTERISTICS

(75) Inventor: Boyd Fowler, Sunnyvale, CA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 1085 days.

(21) Appl. No.: 12/717,609

(22) Filed: Mar. 4, 2010

(65) Prior Publication Data

US 2011/0216231 A1 Sep. 8, 2011

(51) Int. Cl.
*H04N 5/335* (2011.01)
*H01L 27/146* (2006.01)

(52) U.S. Cl.
CPC ............. *H04N 5/335* (2013.01); *H01L 27/146* (2013.01)

(58) Field of Classification Search
USPC ............................. 348/207.99–376, 294–324
See application file for complete search history.

(56) References Cited

U.S. PATENT DOCUMENTS

| 4,716,466 | A * | 12/1987 | Miida et al. | 348/299 |
| 5,461,247 | A * | 10/1995 | Nakashiba | 257/239 |
| 7,414,233 | B2 * | 8/2008 | Asaba | 250/208.1 |
| 7,492,399 | B1 * | 2/2009 | Gulbransen et al. | 348/294 |
| 7,965,329 | B2 * | 6/2011 | McCarten et al. | 348/308 |
| 2003/0027384 | A1 * | 2/2003 | Kawasaki et al. | 438/218 |
| 2004/0053436 | A1 * | 3/2004 | Rhodes | 438/73 |
| 2009/0160987 | A1 * | 6/2009 | Bechtel et al. | 348/302 |
| 2010/0231771 | A1 * | 9/2010 | Yaghmai | 348/308 |

OTHER PUBLICATIONS

PCT/US11/026517, Opinion.
International Search Report, PCT/US2011/026517, Oct. 25, 2011.

* cited by examiner

*Primary Examiner* — Roberto Velez
*Assistant Examiner* — Yih-Sien Kao
(74) *Attorney, Agent, or Firm* — Calvin B. Ward

(57) ABSTRACT

A pixel cell and imaging arrays using the same are disclosed. The pixel cell includes a photodiode that is connected to a floating diffusion node by a transfer gate that couples the photodiode to the floating diffusion node in response to a first gate signal. A shielding electrode shields the floating diffusion node from the first gate signal. An output stage generates a signal related to a charge on the floating diffusion node. In one aspect of the invention, the photodiode is connected to the floating diffusion node by a buried channel, and the shielding electrode includes an electrode overlying the channel and positioned between the transfer gate and the floating diffusion node. The shielding electrode is held at a potential that prevents charge from accumulating under the shielding electrode when the floating diffusion is at the second potential.

11 Claims, 5 Drawing Sheets

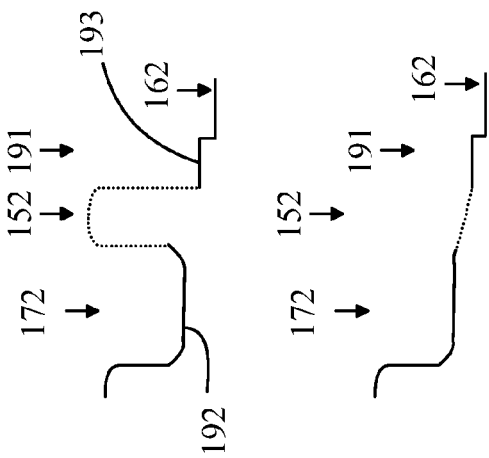
FIGURE 6A
FIGURE 6B
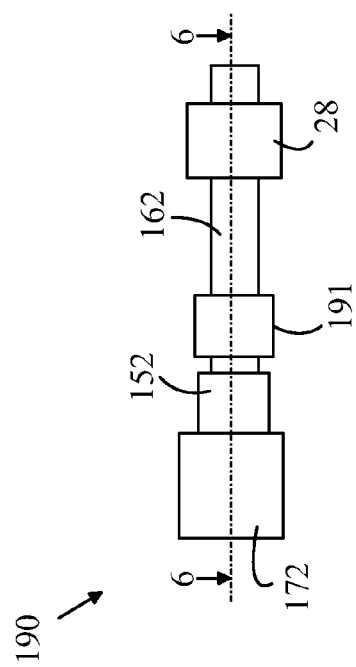
FIGURE 5
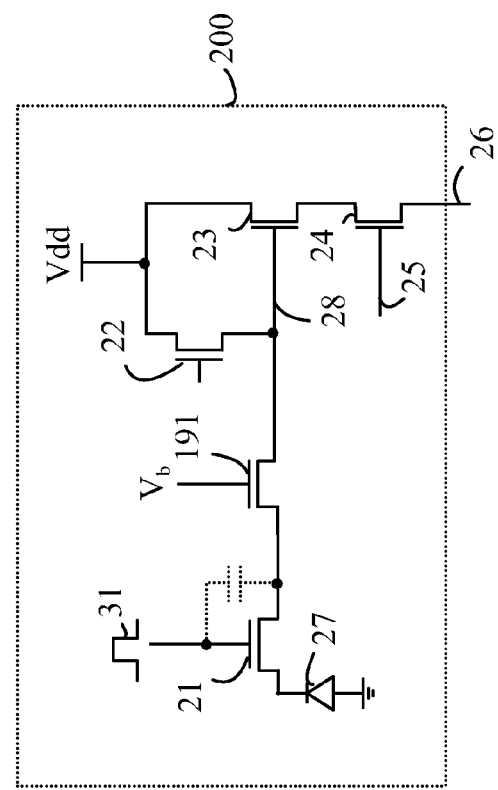
FIGURE 7

CMOS IMAGING ARRAY WITH IMPROVED NOISE CHARACTERISTICS

BACKGROUND OF THE INVENTION

Digital photography based on CMOS imaging sensors has replaced film for most applications. The typical CMOS imaging sensor consists of an array of pixel cells arranged in a rectangular array of cells having a plurality of rows and columns of pixel cells. Each pixel cell includes a photodiode that converts photons received during an exposure to a charge having a magnitude that is proportional to the light received. The stored charge is coupled to a bit line that is shared by all of the pixel cells in the column. The coupling circuit typically includes four transistors. Three of these are concerned with resetting the photodiode between exposures and coupling the pixel to the corresponding bit line when the pixel is to be read. The fourth transistor is typically connected as a source follower and provides the gain needed to drive the capacitance of the bit line. This transistor does not provide voltage gain. The voltage gain needed to provide a sufficient signal to convert with an analog-to-digital converter is provided by a separate amplifier associated with each of the bit lines.

While this design has provided the basis for numerous successful cameras, the noise levels associated with the design are less than optimal. In high light conditions the noise associated with the pixels is less of an issue since other noise sources, such as the digitization noise introduced by the analog-to-digital converter or shot noise, are larger than the readout noise for each pixel. However, at low light levels, the readout noise becomes significant and limits the lowest light levels that can be utilized to form an image. Ideally, the readout noise in the system should be less than the signal generated by one electron in the photodiode. Each photon that is converted in the photodiode generates one electron; hence, once the readout noise is significantly less than one electron, the noise will be dominated by the statistical noise of electron accumulation. Unfortunately, current CMOS arrays have noise that is of the order of the signal generated by 2-10 electrons RMS, and hence, there is room for significant improvement.

SUMMARY OF THE INVENTION

The present invention includes a pixel cell and imaging arrays using the same. The pixel cell includes a photodiode that is connected to a floating diffusion node by a transfer gate that couples the photodiode to the floating diffusion node in response to a first gate signal. A shielding electrode shields the floating diffusion node from the first gate signal. An output stage generates a signal related to a charge on the floating diffusion node. In one aspect of the invention, the photodiode is connected to the floating diffusion node by a buried channel, and the shielding electrode includes an electrode overlying the channel and positioned between the transfer gate and the floating diffusion node. The shielding electrode is held at a potential that prevents charge from accumulating under the shielding electrode when the floating diffusion is at the second potential. In another aspect of the invention, the output stage includes a capacitive transimpedance amplifier having a gain greater than one.

BRIEF DESCRIPTION OF THE DRAWINGS

FIG. 5 is top view of a pinned photodiode and the floating diffusion node according to one embodiment of the present invention.

FIGS. 6A and 6B are graphs of the potential energy as seen by a photo electron along line 6-6 shown in FIG. 5.

FIG. 7 is a schematic drawing of pixel 200.

DETAILED DESCRIPTION OF THE PREFERRED EMBODIMENTS OF THE INVENTION

Figure 1:
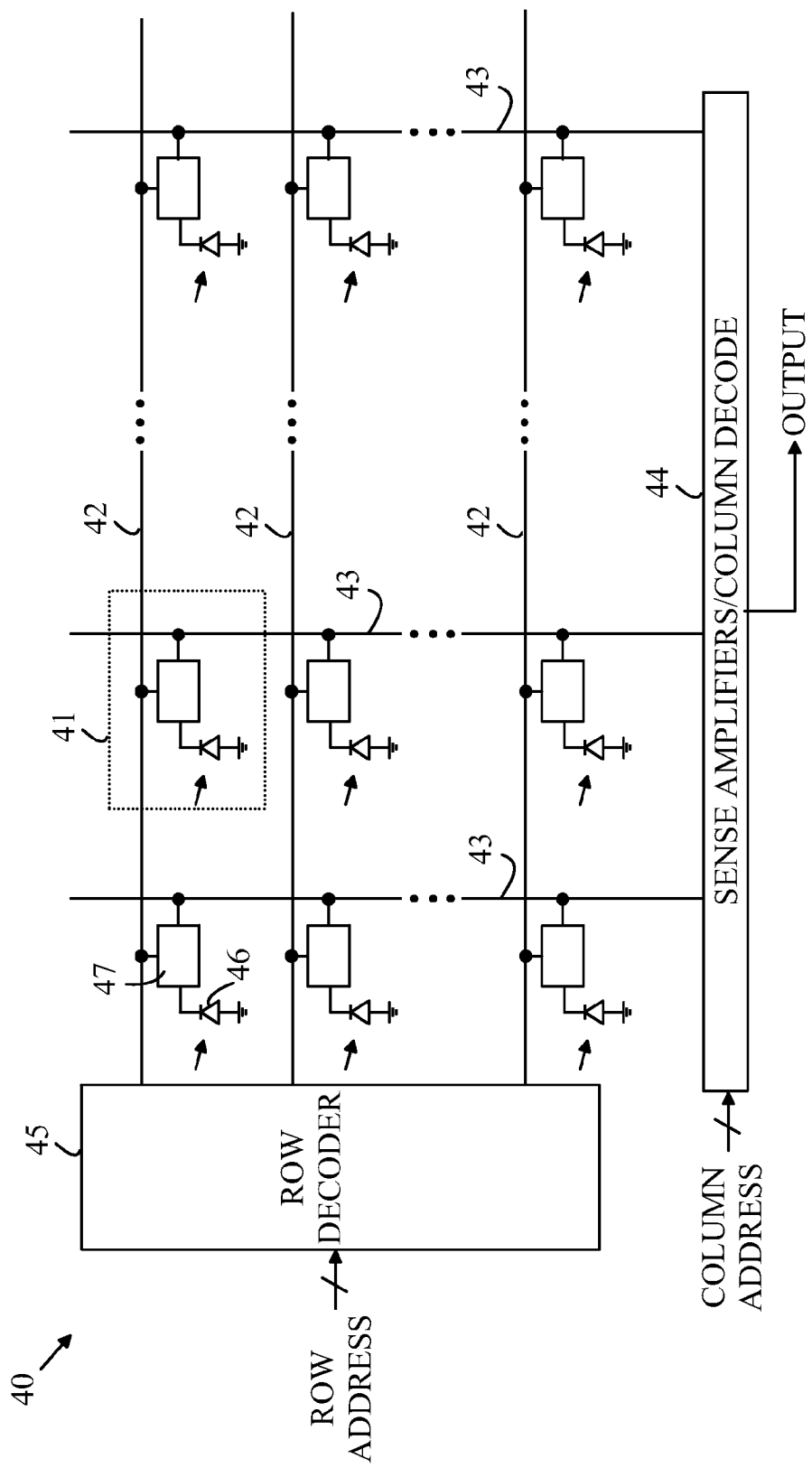
FIG. 1 is a block diagram of a prior art CMOS imaging array.

The manner in which the present invention provides its advantages can be more easily understood with reference to FIG. 1, which is a block diagram of a prior art CMOS imaging array. Imaging array 40 is constructed from a rectangular array of pixel cells 41. Each pixel cell includes a photodiode 46 and an interface circuit 47. The details of the interface circuit depend on the particular pixel design. However, all of the pixel circuits include a gate that is connected to a row line 42 that is used to connect that pixel to a bit line 43. The specific row that is enabled at any time is determined by a bit address that is input to a row decoder 45.

The various bit lines terminate in a column processing circuit 44 that typically includes sense amplifiers and column decoders. Each sense amplifier reads the signal produced by the pixel that is currently connected to the bit line processed by that sense amplifier. The sense amplifiers may generate a digital output signal by utilizing an analog-to-digital converter (ADC). At any given time, a single pixel cell is readout. The specific column that is readout is determined by a column address that is utilized by a column decoder to connect the sense amplifier/ADC output from that column to circuitry that is external to the imaging array.

Figure 2:
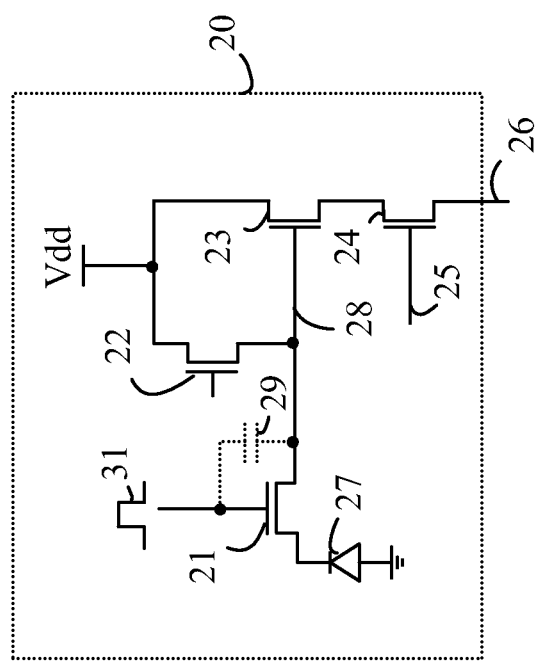
FIG. 2 is a schematic drawing of a typical prior art pixel cell.

Refer now to FIG. 2, which is a schematic drawing of a typical prior art pixel cell. Pixel cell 20 includes a pinned photodiode 27 that is coupled to a floating diffusion node 28 by gate 21. During the exposure of the imaging array to the image being recorded, charge accumulates in photodiode 27. The accumulated charge is transferred to node 28 by applying a signal to gate 21. The charge transferred to node 28 is converted to voltage by the parasitic capacitance associated with the gate of transistor 23, which is connected as a source follower. Transistor 23 provides the gain needed to drive bit line 26 when pixel cell 20 is connected to that bit line via a signal on row select line 25 that is coupled to the gate of transistor 24. Prior to transferring charge from photodiode 27 to node 28, the potential on gate 28 is reset to a predetermined potential via transistor 22. However, there are small variations in the final charge on node 28 after the reset.

A procedure known as correlated double sampling is used to compensate for these variations. The potential on node 28 is then measured by connecting pixel cell 20 to bit line 26. After this starting potential is measured, the charge that accumulated on photodiode 27 is transferred to node 28 and the potential on node 28 is again measured by connecting pixel cell 20 to bit line 26. The difference in the signal between the two potential measurements is the light intensity value that is reported for pixel 20.

This correlated double sampling procedure depends on the potential on node 28 not being altered between the time that the reset potential is measured and the time the potential resulting from the transfer of charge from photodiode 27 to node 28 is measured. Unfortunately, the signal on gate 31 is capacitively coupled to node 28 by a parasitic capacitance shown at 29. Since this capacitance is small, node 28 sees two spikes of opposite polarity that result from the differentiation of signal 31 by capacitor 29. The rising portion of signal 31 generates one spike, and the falling portion generates the other. If the leading and falling edges of signal 31 were identical, these signals would cancel, and hence, would not result in a significant alteration in the potential of node 28. Unfortunately, in practice, the rising and falling edges of signal 31 are not identical, and hence, a net change in the reset voltage of node 28 occurs. This variation gives rise to noise in the image.

Figure 3:
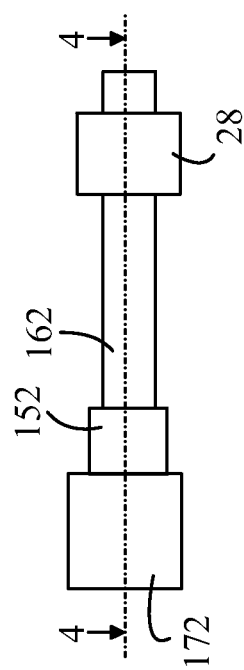
FIG. 3 is a top view of a prior art pinned photodiode.

The present invention reduces this noise by providing a structure that protects node 28 from the signal generated by capacitor 29. Refer now to FIG. 3, which is a top view of a prior art pinned photodiode. Photodiode 150 has a long narrow light conversion region 172, which is constructed from an n-type implant in a p-type substrate. Light conversion region 172 is doped such that the potential energy of an electron trapped in region 172 is greater than that of an electron on node 28.

Light conversion region 172 is connected to the floating diffusion node 28 discussed above by a buried channel 162. A gate 152 applies a potential to channel 162 that either creates or removes a barrier to the flow of electrons from light conversion region 172 to node 28.

Figure 4A:
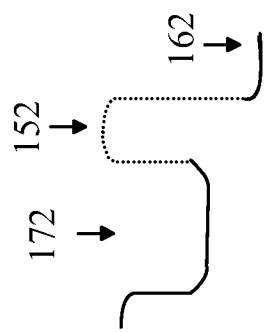
FIGS. 4A and 4B are graphs of the potential energy as seen by a photo electron along line 4-4 shown in FIG. 3.
Figure 4B:
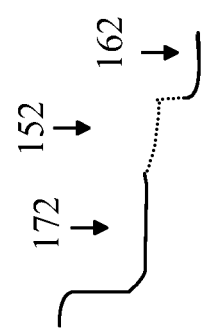

Refer now to FIGS. 4A and 4B, which are graphs of the potential energy as seen by a photo electron along line 4-4 shown in FIG. 3 when different gate voltages are applied to gate 152. As can be seen in FIG. 4A, light conversion region 172 forms a potential well when the potential on gate 152 is set to one value. Photoelectrons that are generated within a charge storage region are trapped in that charge storage region until the potential on gate 152 is altered as shown in FIG. 4B. At that point, the electrons will flow to node 28, since the potential energy of the electrons in light conversion region 172 is above that of electrons on node 28.

The capacitive coupling that gives rise to the noise problems discussed above is the capacitive coupling between gate 152 and node 28. The present invention is based on the observation that this coupling can be reduced by placing a shielding gate between gate 152 and node 28. Refer now to FIGS. 5-7, which illustrate a pixel cell according to one embodiment of the present invention. FIG. 5 is top view of a pinned photodiode 190 and the floating diffusion node according to one embodiment of the present invention. FIGS. 6A and 6B are graphs of the potential energy as seen by a photoelectron along line 6-6 shown in FIG. 5. FIG. 7 is a schematic drawing of pixel 200. To simplify the following discussion, those elements of pixel cell 200 that serve functions analogous to functions served by the elements of pixel cell 20 discussed above with respect to FIGS. 2 and 3 have been given the same numerical designations and will not be discussed further here.

Refer first to FIG. 5. Pinned photodiode 172 has a transfer gate 152 positioned adjacent thereto. In the present invention, a second gate 191 that will be referred to as a shielding gate is placed adjacent to transfer gate 152. Shielding gate 191 is held at a constant potential, and hence, shields node 28 from the electric field created when gate 152 is turned on and off. The shielding potential is chosen such that the shielding potential does not interfere with the transfer of photoelectrons from pinned photodiode 172 to node 28. Referring to FIG. 6A, the bias voltage, $V_b$, on shielding gate 191 is set to a value such that the potential energy 193 as seen by a photoelectron under shielding gate 191 is less than the potential energy in pinned photodiode 172 when no electrons are trapped therein, i.e., the potential energy shown at 192. The bias voltage is also set such that the potential energy of a photoelectron under gate 192 is greater than that of an electron on floating diffusion node 28 when the maximum number of photo electrons are present on node 28. Hence, gate 192 does not interfere with the transfer of electrons from the pinned photodiode to node 28 when the potential on gate 152 is set to release photo electrons that have accumulated in the pinned photodiode as shown in FIG. 6B.

To assure that all of the electrons accumulated in photodiode 172 transfer to node 28, shielding gate 191 must be placed sufficiently close to transfer gate 152 to assure that the portion of the fringe field from shielding gate 191 between transfer gate 152 and shielding gate 191 is sufficient to assure that there is not a potential energy well between the two gates. Such a well could trap a portion of the electrons accumulated in photodiode 172 during the transfer of these electrodes from photodiode 172 to node 28.

The above discussion utilizes the potential energy of the photoelectrons to explain the role of the shielding electrode and its potential. In practice, since electrons are negatively charged, the photodiode is set at a potential that is near ground. The floating diffusion node is reset to $V_{dd}$ prior to the transfer of charge from the photodiode. The charge that is transferred to the floating diffusion causes the floating diffusion node to decrease in potential by an amount determined by the capacitance of the floating diffusion node and the amount of charge that is transferred. In practice, there is some maximum amount of charge that will be transferred, which corresponds to the highest exposure that the photodiode is designed to accommodate. Hence, the floating diffusion will be at a potential between $V_{dd}$ and some minimum potential $V_{min}$ after the charge is transferred to the floating diffusion node. Accordingly, the shielding gate should be set at a potential between ground and $V_{min}$ to assure that all of the accumulated charge will be transferred to the floating diffusion node for any exposure consistent with design of the imaging array.

A second source of noise that limits the noise performance of CMOS pixels arises from the concentration of the gain of the system in a single amplifier that is typically connected to a bit line and shared by all of the pixel cells on the bit line. Since the source follower in the pixel cells does not provide voltage gain, additional gain is needed to bring the signal levels up to levels consistent with further processing such as digitization in an analog-to-digital converter connected to the bit line or amplification for transfer to off-chip circuitry. The noise generated in this amplifier can be a significant barrier to creating an ultra-low noise imaging array. This amplifier will be referred to as the bit line amplifier in the following discussion.

Figure 8:
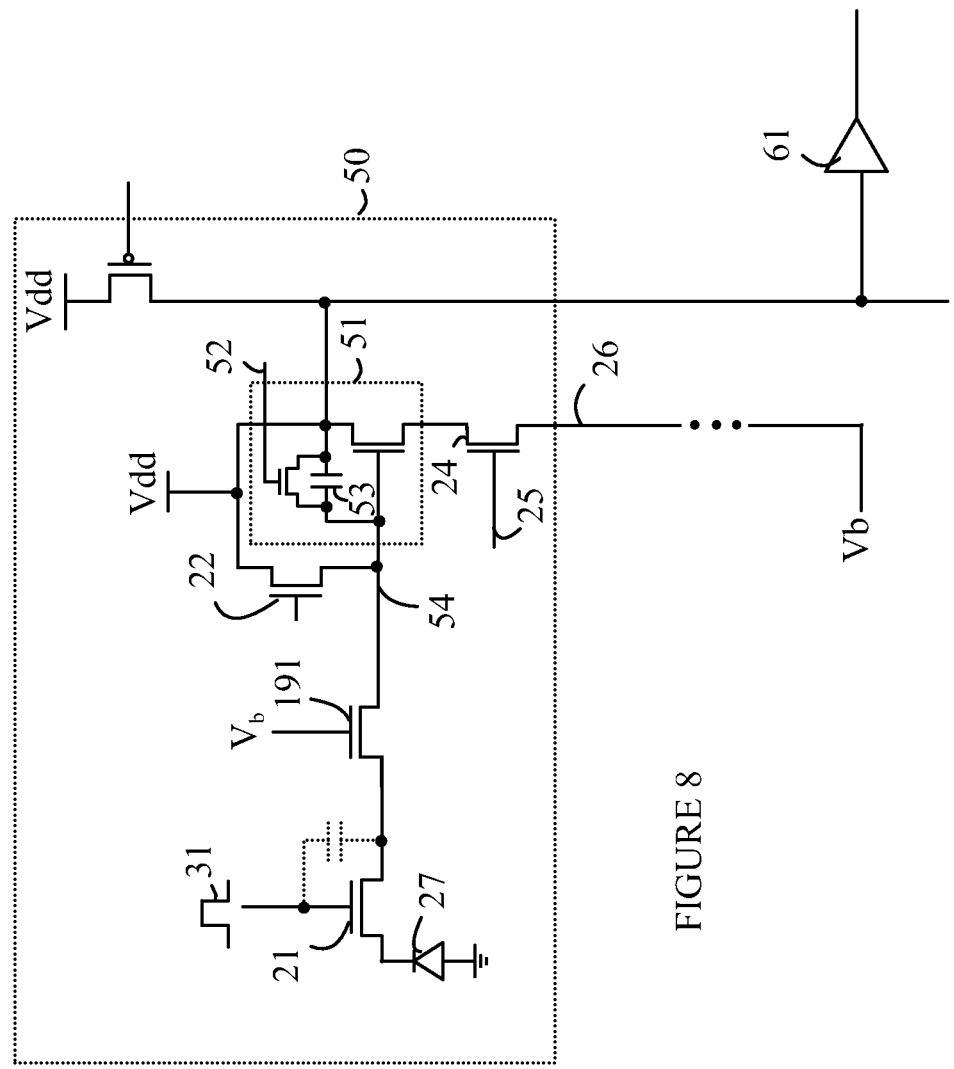
FIG. 8 is a schematic drawing of another embodiment of a pixel according to the present invention.

In one aspect of the present invention, the source follower in each pixel is replaced by a transimpedance amplifier that provides a portion of the gain that is normally supplied by the bit line amplifier. As a result, the amount of gain that must be provided by the bit line amplifier is reduced which leads to an overall reduction in noise levels that result from the amplification of the photodiode signal. Refer now to FIG. 8, which is a schematic drawing of another embodiment of a pixel according to the present invention. In pixel 50, the source follower has been replaced by a capacitive transimpedance amplifier 51. Prior to transferring charge to floating diffusion node 54, capacitor 53 is shorted by applying a signal to line 52. This amplifier reset operation is carried out at the same time that gate 22 is placed in the conducting state prior to transferring charge from photodiode 27. After transimpedance amplifier 51 has been reset, the potential on node 54 is measured and stored in a manner analogous to that described above. The charge stored on photodiode 27 is then transferred to node 54 in a manner analogous to that described above. This charge is effectively transferred to capacitor 53 creating a voltage signal indicative of the amount of charge transferred. When pixel 50 is connected to bit line 26, the resultant signal is further amplified by bit line amplifier 61.

The total voltage gain of the system is the product of the amplification levels provided by amplifiers 51 and 61, and hence, the amount of gain that needs to be provided by each amplifier is significantly reduced. Since the amplification noise is a non-linear function of the gain in each stage, the overall system noise level is further reduced in this embodiment relative to the noise level that would be obtained if only shielding gate 191 were utilized. Ideally, the gains of amplifiers 51 and 61 are substantially equal to one another to minimize the overall amplification noise. However, significant improvements can be achieved with 20 percent of the gain in the pixel and 80 percent of the gain in the column amplifier.

In the above-described embodiments, interference between the transfer gate associated with the pinned photodiode and the floating diffusion node that receives the charge accumulated by the photodiode during the image exposure is significantly reduced by providing an electrode that shields the floating diffusion node from the transfer gate. The interference could also be reduced by separating the floating diffusion node from the transfer gate by a distance that is sufficient to reduce the coupling to an acceptable level. However, merely separating the two structures presents other problems. First, the increased distance increases the pixel size, and hence, the cost of the imaging array. Second, a long channel separating the two structures interferes with the efficient transfer of charge between the photodiode and the floating diffusion node and the conversion of the charge to a voltage level that can be effectively amplified to provide a pixel signal that is not dominated by noise at low light levels.

A long channel increases the capacitance associated with the floating diffusion, as charge transferred from the photodiode will be distributed between the floating diffusion node and the photodiode along the channel. Since the charge-to-voltage conversion is inversely proportional to this capacitance, the available voltage signal at the input to the amplification stage is significantly reduced. This problem is avoided by the above-discussed embodiments for two reasons. First, any increase in the length of the channel is relatively small, since the shielding function is provided by the shielding electrode, not by distancing the transfer gate from the floating diffusion node. Second, the intermediate electric field created by the potential on the shielding electrode prevents charge from accumulating under the shielding electrode, and hence, all of the charge is moved to the floating diffusion node.

The above-described embodiments of the present invention and the Summary of the Invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A pixel cell comprising:
   a photodiode;
   a floating diffusion node;
   a transfer gate that couples said photodiode to said floating diffusion node in response to a first gate signal;
   a shielding electrode that shields said floating diffusion node from said first gate signal; and
   an output stage that generates a signal related to a charge on said floating diffusion node, said shielding electrode being held at a constant potential while said transfer gate couples said photodiode to said floating diffusion node.

2. The pixel cell of claim 1 wherein said photodiode is connected to said floating diffusion node by a buried channel and wherein said shielding electrode comprises an electrode overlying said channel and positioned between said transfer gate and said floating diffusion node.

3. The pixel cell of claim 2 wherein said floating diffusion node operates between first and second potentials, said first potential being greater than said second potential, said potential on said floating diffusion node being dependent on charge transferred from said photodiode, and wherein said shielding electrode is held at a potential that prevents charge from accumulating under said shielding electrode when said floating diffusion is at said second potential.

4. The pixel cell of claim 1 wherein said output stage comprises a capacitive transimpedance amplifier having a gain greater than one.

5. The pixel cell of claim 1 wherein said photodiode is a pinned photodiode.

6. An image sensor comprising:
   a two-dimensional array of CMOS pixel cells organized as a plurality of rows and columns, said pixel sensors in each column being connected to a corresponding bit bus, and each of said pixel sensors in each row being connected to a corresponding row select line, each pixel cell comprising:
   a photodiode;
   a floating diffusion node;
   a transfer gate that couples said photodiode to said floating diffusion node in response to a first gate signal;
   a shielding electrode that shields said floating diffusion node from said first gate signal, said shielding electrode being held at a constant potential while said transfer gate couples sais photodiode to said floating diffusion node; and
   an output stage that generates an output signal related to a charge on said floating diffusion node and couples that output signal to said corresponding bit bus in response to a row select signal on said row select line corresponding to that pixel cell; and
   a row decoder that generates said row select signal on a selected one of said row select lines in response to a row address being coupled thereto.

7. The image sensor of claim 6 wherein said photodiode is connected to said floating diffusion node by a buried channel and wherein said shielding electrode comprises an electrode overlying said channel and positioned between said transfer gate and said floating diffusion node.

8. The image sensor of claim 7 wherein said floating diffusion node operates between first and second potentials, said first potential being greater than said second potential, said potential on said floating diffusion node being dependent on charge transferred from said photodiode, and wherein said shielding electrode is held at potential that prevents charge from accumulating under said shielding electrode when said floating diffusion is at said second potential.

9. The image sensor of claim 6 wherein said output stage comprises a capacitive transimpedance amplifier having a gain greater than one.

10. The image sensor of claim 6 wherein said photodiode is a pinned photodiode.

11. The image sensor of claim 9 further comprising:
a two-dimensional array of CMOS pixel cells organized as a plurality of rows and columns, said pixel sensors in each column being connected to a corresponding bit bus, and each of said pixel sensors in each row being connected to a corresponding row select line, each pixel cell comprising:
a photodiode;
a floating diffusion node;
a transfer gate that couples said photodiode to said floating diffusion node in response to a first gate signal;
a shielding electrode that shields said floating diffusion node from said first gate signal;
an output stage that generates an output signal related to a charge on said floating diffusion node and couples that output signal to said corresponding bit bus in response to a row select signal on said row select line corresponding to that pixel cell; and
a row decoder that generates said row select signal on a selected one of said row select lines in response to a row address being coupled thereto wherein said output stage comprises a capacitive transimpedance amplifier having a gain greater than one, said image sensor
further comprising a column amplifier connected to one of said bit buses, said column amplifier having a gain of substantially equal to said transimpedance amplifier.

\* \* \* \* \*